(12) United States Patent
Cobbley et al.

(10) Patent No.: US 6,329,832 B1
(45) Date of Patent: Dec. 11, 2001

(54) METHOD FOR IN-LINE TESTING OF FLIP-CHIP SEMICONDUCTOR ASSEMBLIES

(75) Inventors: Chad A. Cobbley, Boise; John VanNortwick, Kuna; Bret K. Street, Meridian; Tongbi Jiang, Boise, all of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/166,369

(22) Filed: Oct. 5, 1998

(51) Int. Cl.[7] .............................. G01R 31/26; H01L 23/28
(52) U.S. Cl. .............................. 324/765; 438/17; 257/787; 29/832; 29/840
(58) Field of Search .............................. 324/754, 765; 29/825, 832, 840; 438/17, 18; 257/787, 789, 793

(56) References Cited

U.S. PATENT DOCUMENTS

| | | | |
|---|---|---|---|
| 4,677,528 | * | 6/1987 | Miniet .............................. 361/751 |
| 5,315,241 | * | 5/1994 | Ewers .............................. 324/755 |
| 5,483,174 | * | 1/1996 | Hembree et al. .............................. 324/765 |
| 5,528,157 | * | 6/1996 | Newberry et al. .............................. 324/754 |
| 5,641,996 | * | 6/1997 | Omoya et al. .............................. 257/787 |
| 5,798,652 | * | 8/1998 | Taraci .............................. 324/754 |

* cited by examiner

Primary Examiner—Ernest Karlsen
Assistant Examiner—Russell M. Kobert
(74) Attorney, Agent, or Firm—TraskBritt

(57) ABSTRACT

Flip-chip semiconductor assemblies, each including integrated circuit (IC) dice and an associated substrate, are electrically tested before encapsulation using an in-line or in-situ test socket or probes at a die-attach station. Those assemblies using "wet" quick-cure epoxies for die-attachment may be tested prior to the epoxy being cured by pressing the integrated circuit (IC) dice against interconnection points on the substrate for electrical connection, while those assemblies using "dry" epoxies may be cured prior to testing. In either case, any failures in the dice or in the interconnections between the dice and the substrates can be easily fixed, and the need for the use of known-good-die (KGD) rework procedures during repair is eliminated.

14 Claims, 5 Drawing Sheets

METHOD FOR IN-LINE TESTING OF FLIP-CHIP SEMICONDUCTOR ASSEMBLIES

BACKGROUND OF THE INVENTION

1. Technical Field

This invention relates in general to semiconductor manufacturing and, more specifically, to in-line testing of flip-chip semiconductor assemblies.

2. State of the Art

As shown in FIG. 1, in a conventional process 10 for manufacturing flip-chip semiconductor assemblies, singulated dice are flip-chip attached with a conductive epoxy or solder to a printed circuit board (PCB) or other substrate to form a flip-chip semiconductor assembly. Once the dice are attached by curing of the epoxy or reflow of the solder, the dice are then encapsulated, underfilled, or both, using a non-conductive epoxy or other encapsulation material. The electrical characteristics of the flip-chip semiconductor assembly are then tested and, if the assembly passes the test, it is selected for shipping to customers.

If the flip-chip semiconductor assembly does not pass the test, then it proceeds to a repair station, where it is repaired using one or more known-good dice (KGD) 12 (i.e., dice that have already passed all standard electrical tests and have been through burn-in). Specifically, those dice in the assembly that are believed to have caused the assembly to fail the test are electrically disconnected from the rest of the assembly, typically using laser fuses. One or more KGD are then attached to the PCB of the assembly to replace the disconnected dice. Once the KGD are attached, the assembly is retested and, if it passes, it too is selected for shipping to customers.

The conventional KGD repair process described above generally works well to repair flip-chip semiconductor assemblies, but the process necessary to produce KGD can be an expensive one. Also, the described KGD repair process does not test for, or repair, problems with the interconnections between the dice and the PCB in a flip-chip semiconductor assembly. Rather, it only repairs problems with non-functioning dice or defective solder bumps. Finally, the KGD in the described repair process end up going through burn-in twice a first time so they can be categorized as a KGD, and a second time when the flip-chip semiconductor assembly to which they are attached goes through burn-in. This is obviously a waste of burn-in resources and also stresses the KGD far beyond that necessary to weed out infant mortalities.

Therefore, there is a need in the art for a method of testing flip-chip semiconductor assemblies that reduces or eliminates the need for the KGD repair process described above.

SUMMARY OF THE INVENTION

In a method for electrically testing a flip-chip semiconductor assembly in accordance with this invention, the assembly is tested using, for example, an in-line or in-situ test socket or probes, after one or more integrated circuit (IC) dice and a substrate, such as a printed circuit board (PCB), are brought together to form the assembly, and before the IC dice are encapsulated or otherwise sealed for permanent operation. As a result, any problems with the IC dice or their interconnection to the substrate can be fixed before sealing of the dice complicates repairs. The method thus avoids the problems associated with conventional known-good-die (KGD) repairs. Also, speed grading can be performed while the dice are tested.

The assembly may be manufactured using a "wet" conductive epoxy, such as a heat-snapcurable, moisture curable, or radiation curable epoxy, in which case bond pads on the IC dice can be brought into contact with conductive bumps on the substrate formed of the epoxy for the testing, which can then be followed by curing of the epoxy to form permanent die-to-substrate interconnects if the assembly passes the test. If the assembly does not pass the test, the lack of curing allows for easy repair. After curing but before sealing of the IC dice, the assembly can be tested again to detect any interconnection problems between the IC dice and the substrate.

The assembly may also be manufactured using a "dry" conductive epoxy, such as a thermoplastic epoxy, for conductive die-attach, in which case the IC dice and the substrate can be brought together and the epoxy cured to form permanent die-to-substrate interconnections, after which the testing may take place. Since the testing occurs before sealing of the IC dice, repair is still relatively easy.

DETAILED DESCRIPTION OF THE ILLUSTRATED EMBODIMENTS

Figure 1:
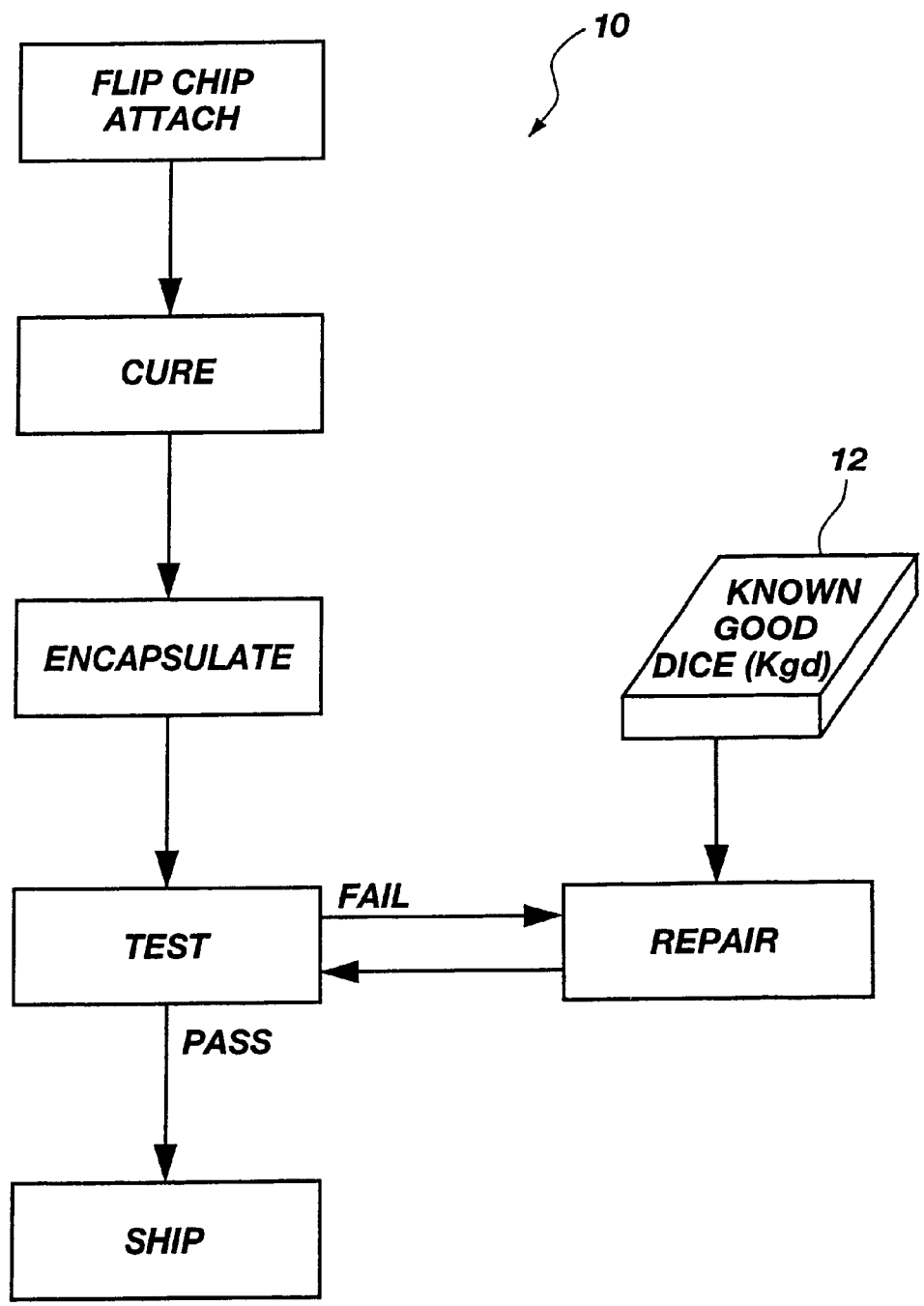
FIG. 1 is a flow chart illustrating a conventional repair method for flip-chip semiconductor assemblies using known-good dice KGD)
Figure 2:
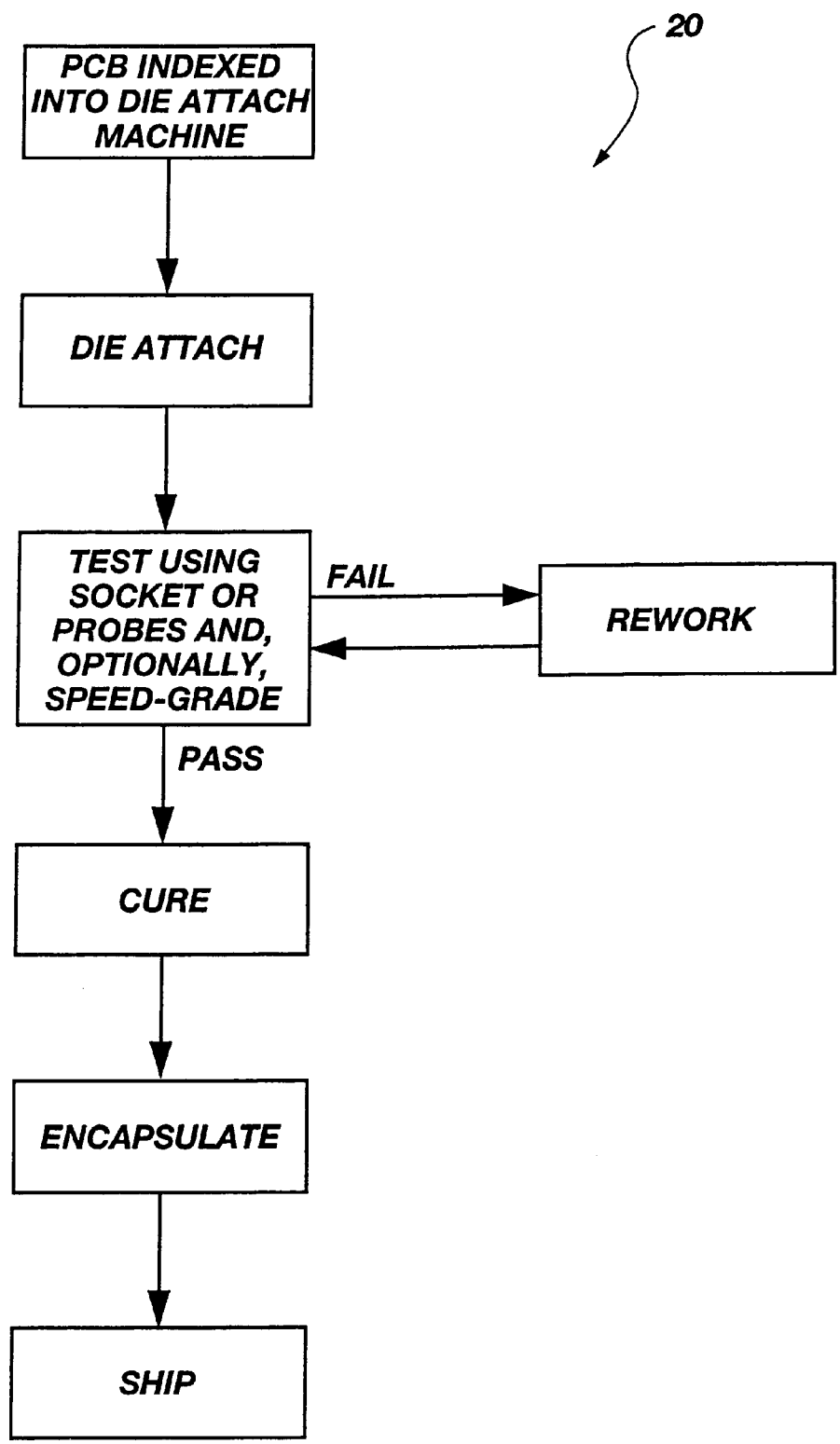
FIG. 2 is a flow chart illustrating a method for in-line testing of flip-chip semiconductor assemblies in accordance with this invention.
Figure 3:
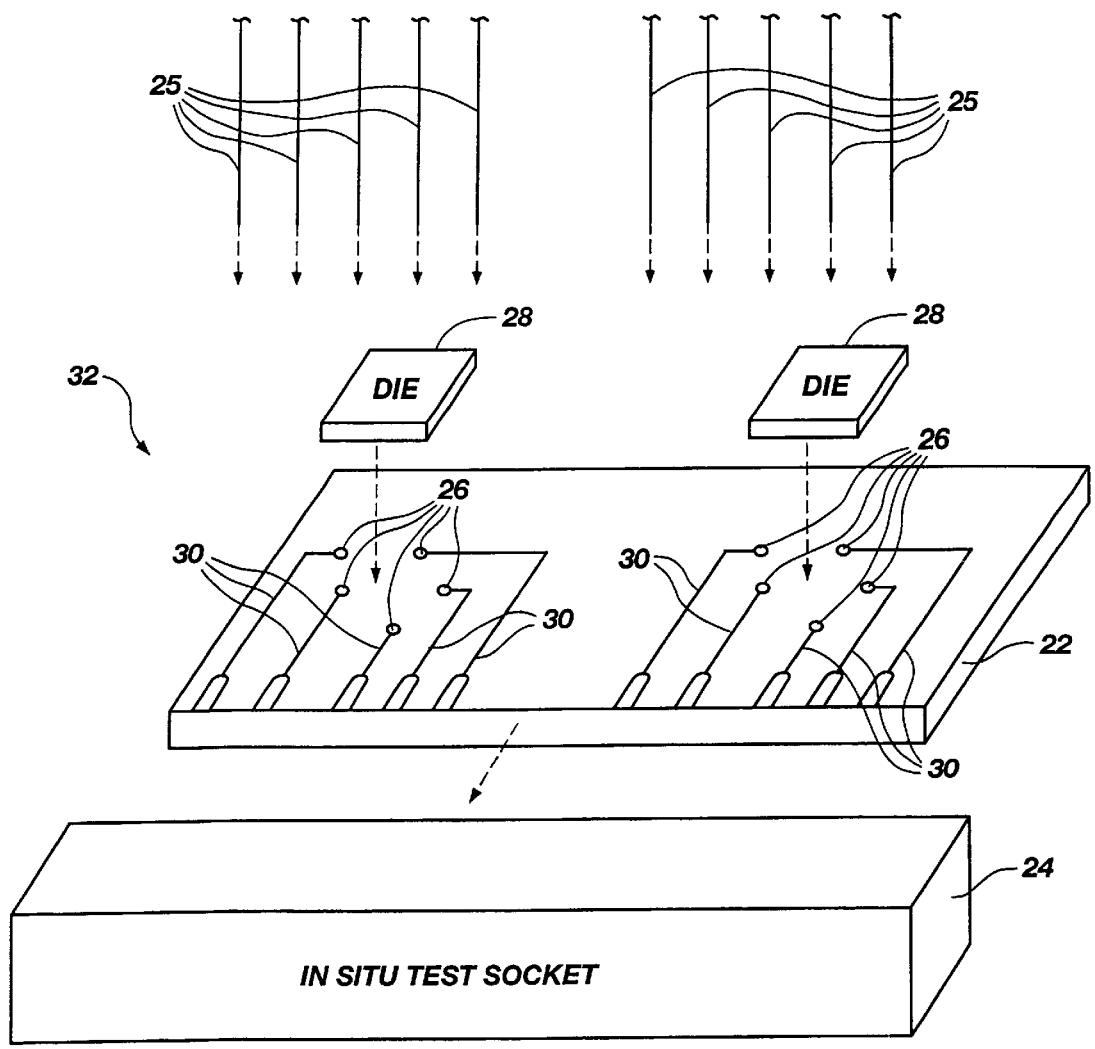
FIG. 3 is an isometric view of a flip-chip semiconductor assembly and in-line test socket or probes implementing the method of FIG. 2.

As shown in FIGS. 2 and 3, in a process 20 for manufacturing flip-chip semiconductor assemblies in accordance with this invention, a printed circuit board (PCB) 22 is indexed into a die attach station (not shown), where it is inserted into an in-line test socket 24 or contacted by probes 25. It will be understood by those having skill in the technical field of this invention that the invention is applicable not only to PCBs, but also to a wide variety of other substrates used in the manufacture of flip-chip semiconductor assemblies.

When conductive epoxy dots 26 or "pads" deposited on the PCB 22 at the die ends of die-to-board-edge conductive traces 30 are made from a "wet" epoxy (i.e., a quick-cure epoxy such as a heat-snapcurable, radiation-curable, or moisture-curable epoxy), then integrated circuit (IC) dice 28 are pressed (active surfaces down) against the dots 26 during flip-chip attach so electrical connections are formed between the dice 28 and the in-line test socket 24 or probes 25 through the dots 26 and conductive traces 30 on the PCB 22. Of course, it will be understood that the invention is also applicable to other flip-chip die-attach methods including, for example, solder-based methods. It will also be understood that the dice 28 may be of any type, including, for example, Dynamic Random Access Memory (DRAM) dice, Static RAM (SRAM) dice, Synchronous DRAM (SDRAM) dice, microprocessor dice, Application-Specific Integrated Circuit (ASIC) dice, and Digital Signal Processor (DSP) dice.

Once such electrical connections are formed, an electrical test is performed on the flip-hip semiconductor assembly 32 formed by the dice 28 and the PCB 22 using the test socket 24 or probes 25. This test typically involves checking for open connections that should be closed, and vice versa, but it can also involve more, fewer, or different electrical tests as need dictates. For example, the testing may also include speed grading the dice 28 for subsequent speed sorting. Also, the testing typically occurs while the PCB 22 is singulated from its carrier (not shown).

If the assembly 32 fails the test, it is diverted to a rework station, where any dice 28 identified as being internally defective or as having a defective interconnection with the PCB 22 can easily be removed and reworked, either by repairing the failing dice 28 themselves, or by repairing conductive bumps (not shown) on the bottom surfaces of the dice 28 used to connect the dice 28 to the conductive epoxy dots 26 on the PCB 22. Once repaired, the assembly 32 returns for retesting and, if it passes, it is advanced in the process 20 for quick curing along with all assemblies 32 that passed the test the first time through.

During quick cure, the "wet" epoxy dots 26 of the assembly 32 are cured, typically using heat, radiation, or moisture. The assembly 32 is then electrically tested again to ensure that the quick curing has not disrupted the interconnections between the dice 28 and the conductive traces 30 through the conductive epoxy dots 26 and the bumps (not shown) on the bottom surfaces of the dice 28. If quick curing has disrupted these interconnections, then the assembly 32 proceeds to the rework station, where the connections between the bumps and the dots 26 can be repaired. The repaired assembly 32 is then retested and, if it passes, it proceeds to encapsulation (or some other form of sealing) and, ultimately, is shipped to customers along with those assemblies 32 that passed this testing step the first time through. Of course, it should be understood that this invention may be implemented with only one test stage for "wet" epoxy assemblies, although two stages are preferable.

When the conductive epoxy dots 26 are made from a "dry" epoxy (e.g., a thermoplastic epoxy), then the PCB 22 is indexed and inserted into the test socket 24 or connected to the probes 25 as described above, but the dice 28 are attached to the PCB 22 using heat before the assembly 32 proceeds to testing. Testing typically takes place while the PCB 22 is singulated from its carrier (not shown).

During testing, if the assembly 32 fails, then it proceeds to a rework station, where the bumps on the bottom of the dice 28, the dice 28 themselves, or the interconnection between the bumps and the conductive epoxy dots 26 can be repaired. The repaired assembly 32 then proceeds to encapsulation (or some other form of sealing) and, eventually, is shipped to customers along with those assemblies 32 that passed the testing the first time through.

Thus, this invention provides a repair method for flip-chip semiconductor assemblies that is less expensive than the previously described known-good-die (KGD) based rework process, because it does not require the pretesting of dice that the KGD process requires. Also, the methods of this invention are applicable to testing for both internal die defects and die-to-PCB interconnection defects, and to repairing interconnections between dice and a PCB in a flip-chip semiconductor assembly, whereas the conventional KGD process is not. In addition, these inventive methods do not waste burn-in resources, in contrast to the conventional KGD process previously described. Finally, this invention allows for early and convenient speed grading of flip-chip semiconductor assemblies.

Figure 4:
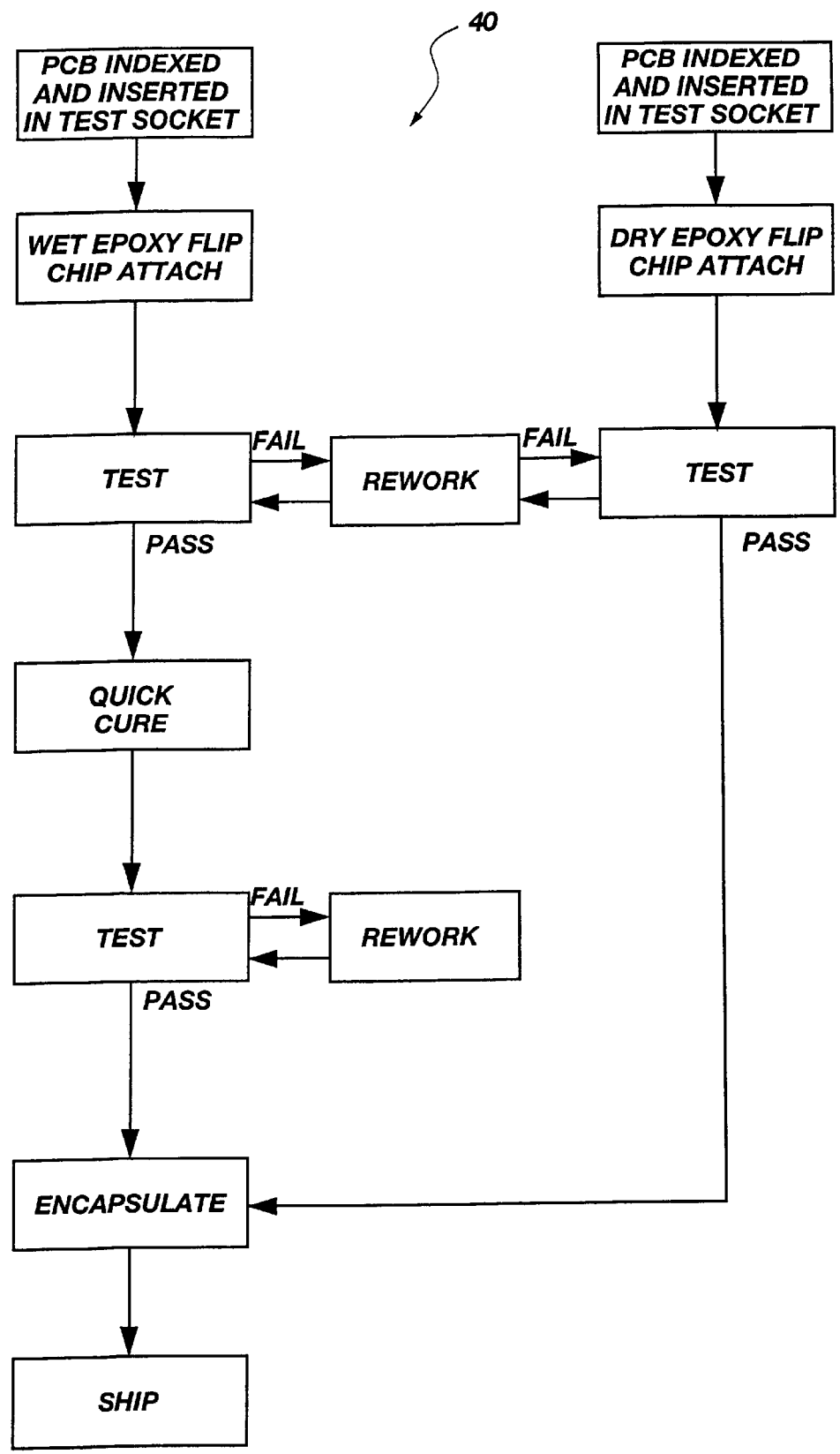
FIG. 4 is a flow chart illustrating a method for in situ testing of flip-chip semiconductor assemblies in accordance with this invention.
Figure 5:
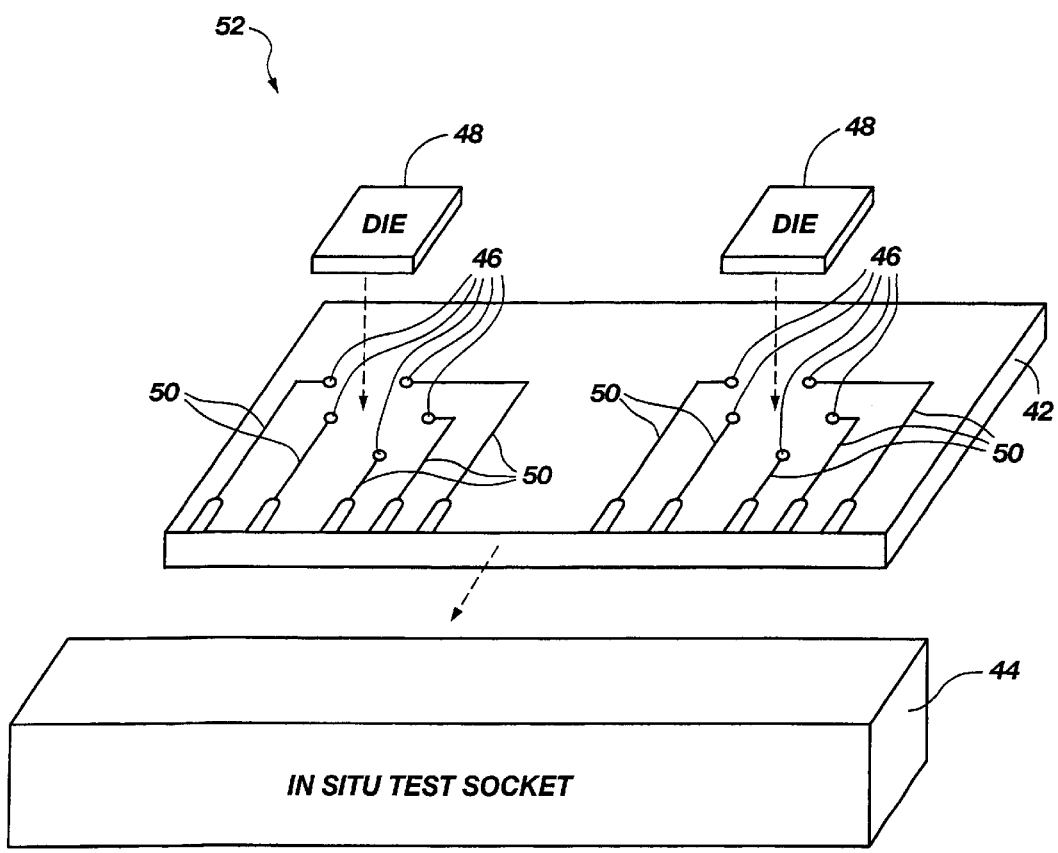
FIG. 5 is an isometric view of a flip-chip semiconductor assembly and in situ test socket implementing the method of FIG. 4.

As shown in FIGS. 4 and 5, in a process 40 for manufacturing flip-chip semiconductor assemblies in accordance with this invention, a printed circuit board (PCB) 42 is indexed into a die attach station (not shown), where it is inserted into an in situ test socket 44. It will be understood by those having skill in the technical field of this invention that the invention is applicable not only to PCBs, but also to a wide variety of other substrates used in the manufacture of flip-chip semiconductor assemblies.

When conductive epoxy dots 46 or "pads" deposited on the PCB 42 at the die ends of die-to-board-edge conductive traces 50 are made from a "wet" epoxy (i.e., a quick-cure epoxy such as a heat-snap-curable, radiation-curable, or moisture-curable epoxy), then integrated circuit (IC) dice 48 are pressed (active surfaces down) against the dots 46 during flip-chip attach so electrical connections are formed between the dice 48 and the in situ test socket 44 through the dots 46 and conductive ties 50 on the PCB 42. Of course, it win be understood that the invention is also applicable to other flip-chip die-attach methods including, for example, solder-based methods. It will also be understood that the dice 48 may be of any type, including, for example, Dynamic Random Access Memory (DRAM) dice, Static RAM (SRAM) dice, Synchronous DRAM (SDRAM) dice, microprocessor dice, Application-Specific Integrated Circuit (ASIC) dice, and Digital Signal Processor (DSP) dice.

Once such electrical connections are formed, an electrical test is performed on the flip-chip semiconductor assembly 52 formed by the dice 48 and the PCB 42 using the test socket 44. This test typically involves checking for open connections that should be closed, and vice versa, but it can also involve more, fewer, or different electrical tests as need dictates. If the assembly 52 fails the test, it is diverted to a rework station, where any dice 48 identified as being internally defective or as having a defective interconnection with the PCB 42 can easily be removed and reworked, either by repairing the failing dice 48 themselves, or by repairing conductive bumps (not shown) on the bottom surfaces of the dice 48 used to connect the dice 48 to the conductive epoxy dots 46 on the PCB 42. Once repaired, the assembly 52 returns for retesting and, if it passes, it is advanced in the process 40 for quick curing along with all assemblies 52 that passed the test the first time through.

During quick cure, the "wet" epoxy dots 46 of the assembly 52 are cured, typically using heat, radiation, or moisture. The assembly 52 is then electrically tested again to ensure that the quick curing has not disrupted the interconnections between the dice 48 and the conductive traces 50 through the conductive epoxy dots 46 and the bumps (not shown) on the bottom surfaces of the dice 48. If quick curing has disrupted these interconnections, then the assembly 52 proceeds to another rework station, where the connections between the bumps and the dots 46 can be repaired. The repaired assembly 52 is then retested and, if it passes, it proceeds to encapsulation (or some other form of sealing) and, ultimately, is shipped to customers along with those assemblies 52 that passed 5 this testing step the first time through. Of course, it should be understood that this invention may be implemented with only one test stage for "wet" epoxy assemblies, although the two stages shown in FIG. 4 are preferable.

When the conductive epoxy dots 46 are made from a "dry" epoxy (e.g., a thermoplastic epoxy), then the PCB 42 is indexed and inserted into the test socket 44 as described above, but the dice 48 are attached to the PCB 42 using heat before the assembly 52 proceeds to testing. During testing, if the assembly 52 fails, then it proceeds to a rework station, where the bumps on the bottom of the dice 48, the dice 48 themselves, or the interconnection between the bumps and the conductive epoxy dots 46 can be repaired. The repaired assembly 52 then proceeds to encapsulation (or some other form of sealing) and, eventually, is shipped to customers along with those assemblies 52 that passed the testing the first time through.

Thus, this invention provides a repair method for flip-chip semiconductor assemblies that is less expensive than the previously described known-good-die (KGD) based rework process, because it does not require the pretesting of dice that the KGD process requires. Also, the methods of this invention are applicable to testing for both internal die defects and die-to-PCB interconnection defects, and to repairing interconnections between dice and a PCB in a flip-chip semiconductor assembly, whereas the conventional KGD process is not. In addition, these inventive methods do not waste burn-in resources, in contrast to the conventional KGD process previously described.

Although this invention has been described with reference to particular embodiments, the invention is not limited to these described embodiments. Rather, the invention is limited only by the appended claims, which include within their scope all equivalent methods that operate according to the principles of the invention as described.

We claim:

1. A method for electrically testing a flip-chip semiconductor assembly, comprising: providing at least one integrated circuit (IC) die having bond pads on a surface thereof; providing a substrate having electrical pads for mounting said at least one IC die thereto; placing curable wet conductive epoxy dots on said electrical pads on said substrate;

attaching said at least one IC die to said substrate with said bond pads of said at least one IC die in contact with said curable wet conductive epoxy dots on said electrical pads on said substrate to form said flip-chip semiconductor assembly;

testing said flip-chip semiconductor assembly;

if said flip-chip semiconductor assembly fails said testing, then reworking said flip-chip semiconductor assembly and retesting said flip-chip semiconductor assembly or scrapping said flip-chip semiconductor assembly if it has already been reworked a preset number of times;

if said flip-chip semiconductor assembly passes said testing, then curing said curable wet conductive epoxy dots; and encapsulating said at least one IC die on said substrate.

2. The method of claim 1, further comprising providing said substrate as a printed circuit board (PCB).

3. The method of claim 1, wherein said curable wet conductive epoxy dots comprise heat-curable epoxy and further comprising subjecting said heat curable epoxy to heat to cure said heat-curable epoxy.

4. The method of claim 1, wherein said curable wet conductive epoxy dots comprise radiationble epoxy and further comprising subjecting said radiation-curable epoxy to radiation to cure said radiation-curable epoxy.

5. The method of claim 1, wherein said curable wet conductive epoxy dots comprise moisture-curable epoxy and further comprising subjecting said moisture-curable epoxy to moisture to cure said moisture curable epoxy.

6. The method of claim 1 wherein, said attaching said at least one IC die to said substrate comprises:

aligning said bond pads on said at least one IC die with said curable wet conductive epoxy dots on said electrical pads on said substrate; and contacting said aligned bond pads on said at least one IC die with said curable wet conductive epoxy dots on said electrical pads on said substrate to form electrical connections therebetween.

7. The method of claim 1, further comprising speed grading said at least one IC die.

8. The method of claim 7, wherein said speed grading is performed after testing said flip-chip semiconductor assembly.

9. A method for electrically testing a flip-chip semiconductor assembly, comprising:

providing at least one integrated circuit (IC) die having bond pads on a surface thereof;

providing a substrate having electrical pads for mounting said at least one IC die thereto;

placing dry conductive epoxy dots on said electrical pads on said substrate;

attaching said at least on IC die to said substrate with said bond pads of said at least one IC die in contact with said dry conductive epoxy dots on said electrical pads on said substrate to form said flip-chip semiconductor assembly;

testing said flip-chip semiconductor assembly;

if said flip-chip semiconductor assembly fails said testing, then reworking said flip-chip semiconductor assembly and retesting said flip-chip semiconductor assembly or scrapping said flip-chip semiconductor assembly if it has already been reworked a preset number of times; and if said flip-chip semiconductor assembly passes said testing, then encapsulating said at least one IC die on said substrate.

10. The method of claim 9, wherein said substrate comprises a printed circuit board (PCB).

11. The method of claim 9, wherein said dry conductive epoxy dots comprise thermoplastic epoxy and further comprising heating said thermoplastic epoxy followed by cooling.

12. The method of claim 11, wherein said attaching said at least one IC die to said substrate comprises:

aligning said bond pads on said at least one IC die with said thermoplastic epoxy dots on said electrical pads on said substrate;

contacting said aligned bond pads on said at least one IC die with said thermoplastic epoxy dots on said substrate; and heating said flip-chip semiconductor assembly to form electrical connections between said aligned bond pads on said at least one IC die and said electrical pads on said substrate.

13. The method of claim 9, further comprising speed grading said at least one IC die.

14. The method of claim 13, wherein said speed grading is performed after testing said flip-chip semiconductor assembly.

* * * * *

UNITED STATES PATENT AND TRADEMARK OFFICE
CERTIFICATE OF CORRECTION

PATENT NO. : 6,329,832 B1  Page 1 of 1
DATED : December 11, 2001
INVENTOR(S) : Chad A. Cobbley et al.

It is certified that error appears in the above-identified patent and that said Letters Patent is hereby corrected as shown below:

Column 1,
Line 26, change "bum-in" to -- burn-in --
Line 43, insert a colon after "twice"

Column 2,
Lines 2 and 52, change "heat-snapcurable" to -- heat-snap-curable --
Line 24, change "KGD);" to -- (KGD); --

Column 3,
Line 2, change "flip-hip" to -- flip-chip --

Column 4,
Line 18, change "ties" to -- traces -- and change "win" to -- will --
Line 57, after "passed" delete "5"

Column 5,
Line 55, change "radiationble" to -- radiation-curable --
Line 61, insert a hyphen between "moisture" and "curable"

Signed and Sealed this

Fifth Day of August, 2003

JAMES E. ROGAN
*Director of the United States Patent and Trademark Office*